(12) United States Patent
Nosaka et al.

(10) Patent No.: US 12,525,442 B2
(45) Date of Patent: Jan. 13, 2026

(54) PLASMA PROCESSING APPARATUS, DATA ANALYSIS APPARATUS, AND SEMICONDUCTOR DEVICE MANUFACTURING SYSTEM

(71) Applicant: HITACHI HIGH-TECH CORPORATION, Tokyo (JP)

(72) Inventors: Shunta Nosaka, Tokyo (JP); Daisuke Shiraishi, Tokyo (JP); Akira Kagoshima, Tokyo (JP)

(73) Assignee: HITACHI HIGH-TECH CORPORATION, Tokyo (JP)

(*) Notice: Subject to any disclaimer, the term of this patent is extended or adjusted under 35 U.S.C. 154(b) by 180 days.

(21) Appl. No.: 17/909,512

(22) PCT Filed: Jul. 14, 2021

(86) PCT No.: PCT/JP2021/026384
§ 371 (c)(1),
(2) Date: Sep. 6, 2022

(87) PCT Pub. No.: WO2023/286180
PCT Pub. Date: Jan. 19, 2023

(65) Prior Publication Data
US 2024/0203712 A1    Jun. 20, 2024

(51) Int. Cl.
*H01J 37/32* (2006.01)
*H01L 21/67* (2006.01)

(52) U.S. Cl.
CPC .. *H01J 37/32972* (2013.01); *H01L 21/67253* (2013.01); *H01J 37/32082* (2013.01); *H01J 2237/24585* (2013.01)

(58) Field of Classification Search
CPC ........... H01J 37/32082; H01J 37/32917; H01J 37/32972; H01J 2237/24585; H01L 21/67253
See application file for complete search history.

(56) References Cited

U.S. PATENT DOCUMENTS 5,160,402 A    11/1992  Cheng
5,347,460 A    9/1994   Gifford et al.
(Continued)

FOREIGN PATENT DOCUMENTS

CN    103903951 A    7/2014
JP    H04-229620 A   8/1992
(Continued)

OTHER PUBLICATIONS

Search Report mailed Oct. 5, 2021 in International Application No. PCT/JP2021/026384.
(Continued)

*Primary Examiner* — Kevin K Pyo
(74) *Attorney, Agent, or Firm* — Miles & Stockbridge, P.C.

(57) ABSTRACT

Provided is a plasma processing apparatus, a data analysis apparatus, and a semiconductor device manufacturing system, capable of assigning an appropriate chemical element or molecule on the basis of the features of a peak shape and capable of performing wavelength identification with high accuracy. The plasma processing apparatus includes: a processing chamber in which a sample is plasma-processed; a radio-frequency power supply that supplies radio-frequency power to generate plasmas; and a sample table on which the sample is placed, the plasma processing apparatus further including an analysis unit that identifies chemical elements or molecules in monitored plasmas on the basis of a match degree between a first spectral waveform and a second spectral waveform, the match degree being obtained by comparing the first spectral waveform with the second spectral waveform, the first and second spectral waveforms being spectral waveforms of the emission of the monitored plasmas, wherein the second spectral waveform is a spectral
(Continued)

waveform multiplied by a weight coefficient corresponding to the chemical element or the molecule.

10 Claims, 15 Drawing Sheets

(56) References Cited

U.S. PATENT DOCUMENTS

| | | |
|---|---|---|
| 6,586,262 B1 | 7/2003 | Saito et al. |
| 9,091,595 B2 | 7/2015 | Asakura et al. |
| 2004/0032592 A1 | 2/2004 | Venugopal et al. |
| 2004/0032593 A1 | 2/2004 | Venugopal |
| 2004/0087041 A1 | 5/2004 | Perry et al. |
| 2004/0200718 A1 | 10/2004 | Oh et al. |
| 2006/0035395 A1 | 2/2006 | Venugopal |
| 2008/0236748 A1* | 10/2008 | Kobayashi ........ H01J 37/32623 156/345.27 |
| 2014/0022540 A1 | 1/2014 | Asakura et al. |
| 2014/0262029 A1* | 9/2014 | Asakura ............ H01J 37/32972 356/402 |
| 2020/0181763 A1 | 6/2020 | Waldner |

FOREIGN PATENT DOCUMENTS

| | | |
|---|---|---|
| JP | 2521406 B2 | 8/1996 |
| JP | 2000-331985 A | 11/2000 |
| JP | 2004-186539 A | 7/2004 |
| JP | 2005-536075 A | 11/2005 |
| JP | 2014-022621 A | 2/2014 |
| JP | 2014-179474 A | 9/2014 |
| JP | 6088867 B2 | 3/2017 |
| JP | 2019-522725 A | 8/2019 |

OTHER PUBLICATIONS

Written Opinion mailed Oct. 5, 2021 in International Application No. PCT/JP2021/026384.

* cited by examiner

PLASMA PROCESSING APPARATUS, DATA ANALYSIS APPARATUS, AND SEMICONDUCTOR DEVICE MANUFACTURING SYSTEM

TECHNICAL FIELD

The present invention relates to a plasma processing apparatus, a data analysis apparatus, and a semiconductor device manufacturing system.

BACKGROUND ART

There are known plasma processing apparatuses, such as etching apparatuses that etch wafers by plasmas generated in a processing chamber to obtain fine shapes of semiconductor devices or the like.

Since an ionization phenomenon by plasmas is accompanied by a luminous phenomenon, some etching apparatuses that perform processing by using plasmas are each equipped with a spectrometer so that the light emitted by the plasmas is able to be monitored. Monitoring the light emitted by the plasmas enables troubleshooting, for example. The data measured by the spectrometer is hereinafter referred to as emission data.

The emission data is composed of emission intensity values at a plurality of wavelengths and times. Since the number of wavelength data collected by the spectrometer is several thousands, there has been a problem of selecting the wavelengths to be analyzed from among the large number of wavelength data.

Patent Document 1 describes a technique for achieving identification of the wavelength (referred to as "wavelength identification") to be used for the analysis of etching processing from the plasma emission data. With this conventional technique for the emission spectrum for which wavelength identification is required, the chemical element corresponding to the wavelength of the peak in the emission data is able to be identified.

Moreover, Patent document 2 describes a method of identifying a chemical element assigned to the peak of emission data by using a pattern model.

CITATION LIST

Patent Documents

Patent Document 1: Japanese Patent No. 6088867
Patent Document 2: Japanese Patent No. 2521406

SUMMARY OF THE INVENTION

Problem to be Solved by the Invention

The technique described in Patent Document 1, however, uses only the wavelength and intensity of the peak extracted from the spectral waveform of the emission data, and does not cover the shape of the peak, which may result in assigning an incorrect chemical element to the wavelength of the peak.

In addition, the technique described in Patent Document 2 may double assign a correct chemical element and an incorrect chemical element to one peak. In this case, it is necessary to judge which is the correct chemical element on the basis of an analyst's experience, and it is conceivable that the analyst may have difficulty in making such a judgment.

Therefore, it is an object of the present invention to provide a plasma processing apparatus, a data analysis apparatus, and a semiconductor device manufacturing system capable of assigning an appropriate chemical element or molecule on the basis of the features of a peak shape and capable of performing wavelength identification with high accuracy.

Means for Solving the Problems

To achieve the above object, as one of the typical plasma processing apparatuses according to the present invention, there is provided a plasma processing apparatus including: a processing chamber in which a sample is plasma-processed; a radio-frequency power supply that supplies radio-frequency power to generate plasmas; and a sample table on which the sample is placed, wherein the plasma processing apparatus further includes an analysis unit that identifies chemical elements or molecules in monitored plasmas on the basis of a match degree between a first spectral waveform and a second spectral waveform, the match degree being obtained by comparing the first spectral waveform with the second spectral waveform, the first and second spectral waveforms being spectral waveforms of the emission of the monitored plasmas, and wherein the second spectral waveform is a spectral waveform multiplied by a weight coefficient corresponding to the chemical element or the molecule.

Moreover, as one of the typical data analysis apparatuses according to the present invention, there is provided a data analysis apparatus including an analysis unit that identifies chemical elements or molecules in monitored plasmas on the basis of a match degree between a first spectral waveform and a second spectral waveform, the match degree being obtained by comparing the first spectral waveform with the second spectral waveform, the first and second spectral waveforms being spectral waveforms of the emission of the monitored plasmas, wherein the second spectral waveform is a spectral waveform multiplied by a weight coefficient corresponding to the chemical element or the molecule in the plasmas.

Furthermore, as one of the typical semiconductor device manufacturing systems according to the present invention, there is provided a semiconductor device manufacturing system connected to a semiconductor manufacturing device via a network and having a platform where analysis processing is performed to identify chemical elements or molecules in plasmas, wherein the analysis processing includes a step of identifying chemical elements or molecules in monitored plasmas on the basis of a match degree between a first spectral waveform and a second spectral waveform, the match degree being obtained by comparing the first spectral waveform with the second spectral waveform, the first and second spectral waveforms being spectral waveforms of the emission of the monitored plasmas, and wherein the second spectral waveform is a spectral waveform multiplied by a weight coefficient corresponding to the chemical element or the molecule in the plasmas.

Advantageous Effect of the Invention

The present invention provides a plasma processing apparatus, a data analysis apparatus, and a semiconductor device manufacturing system capable of assigning an appropriate chemical element or molecule on the basis of the features of a peak shape and capable of performing wavelength identification with high accuracy.

Problems, configurations, and advantageous effects other than those described above are clarified in the following description of the embodiments.

MODES FOR CARRYING OUT THE INVENTION

The embodiments of the present invention are described below with reference to drawings. In this specification, a chemical element or molecule is referred to as "element."

First Embodiment

Figure 1:
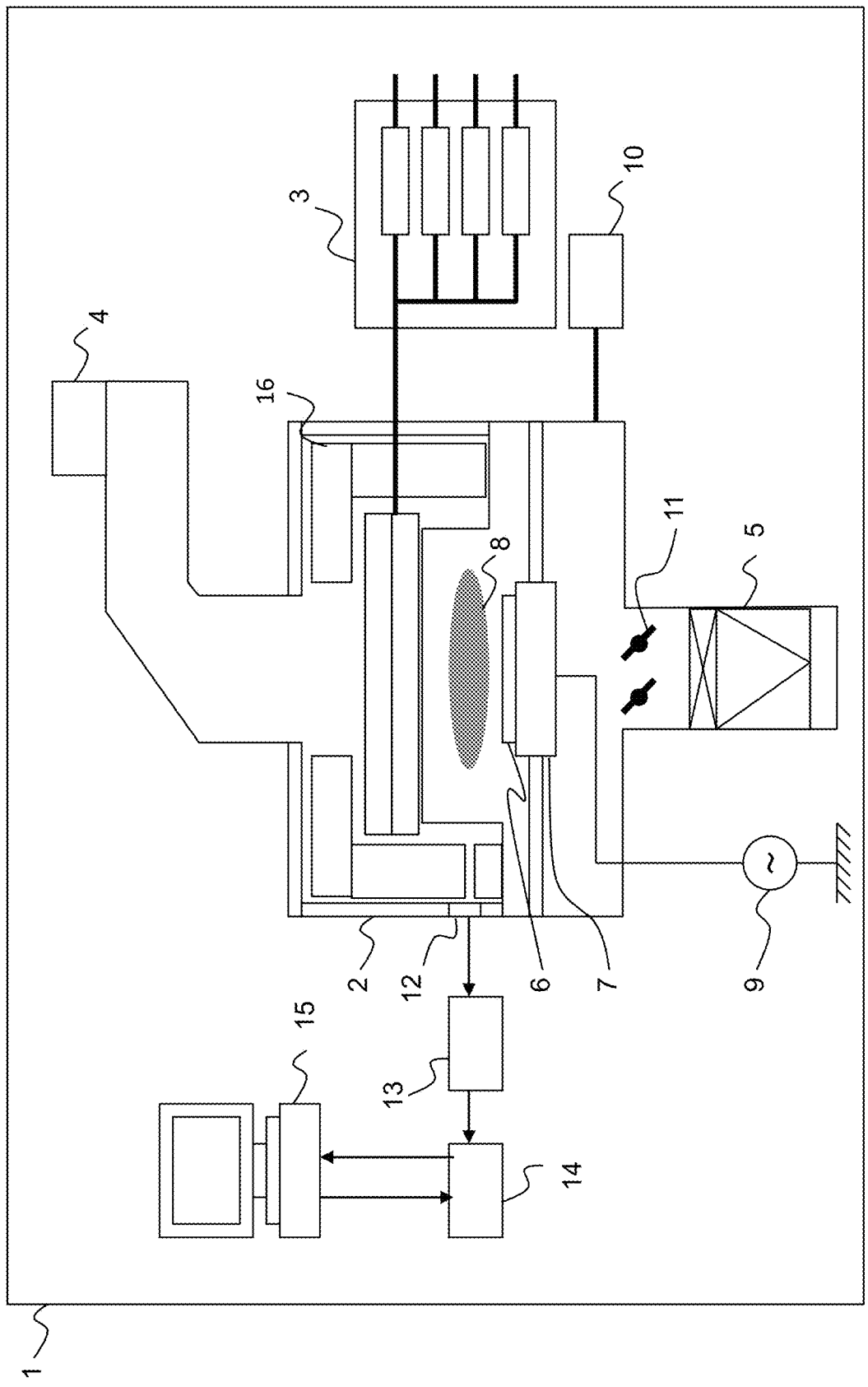
FIG. 1 is a diagram illustrating the outline of the configuration of a plasma processing apparatus according to an embodiment of the present invention.

FIG. 1 is a schematic diagram illustrating the outline of the configuration of a plasma processing apparatus 1 according to one embodiment of the present invention. The plasma processing apparatus 1 includes a processing chamber 2 in which plasma processing is performed, and a mass flow controller 3 that adjusts the supply amount and speed of processing gas supplied into the processing chamber 2, a radio-frequency power supply for plasma generation 4 that supplies radio-frequency power for exciting the processing gas supplied to the processing chamber 2 to generate plasmas, and an exhaust device 5 that includes a vacuum pump for exhausting the gas in the processing chamber 2. A sample table 7 is placed below the space where the plasmas are generated in the processing chamber 2, and a wafer 6, which is a sample to be processed, is held on the top surface of the sample table 7.

The processing gas used for etching processing is supplied into the processing chamber 2 via the mass flow controller 3. The radio-frequency power at a predetermined frequency (for example, 2.45 GHz) supplied by the radio-frequency power supply for plasma generation 4 is introduced into the processing chamber by means of a waveguide or other propagation means placed above the processing chamber 2. In addition, a magnetic field is formed in the processing chamber 2 by a magnetic field forming means 16 placed around the processing chamber 2 at the upper and lateral periphery of the processing chamber 2. The interaction between the radio-frequency power and the magnetic field excites the gas particles and generates plasmas 8 in the processing chamber 2.

Electrodes made of conductive material are arranged inside the sample table 7, and a bias electric field is formed above the top surface of the sample table 7 or of the wafer 6 held on the mounting surface of the top surface of the sample table 7 by the radio-frequency power supplied to the electrodes from the radio-frequency power supply for bias 9. The formed bias electric field induces charged particles (ions) in the plasmas 8 to collide with the thin film formed on the surface of the wafer 6. This activates the surface of the wafer 6 and promotes chemical and physical interactions between the reactive particles in the plasmas 8 and the materials constituting the film, thus facilitating the etching processing of the target film.

A variable conductance valve 11 is placed in the passage that connects the inside of the processing chamber 2 to the exhaust device 5. The variable conductance valve 11 is a valve with a plurality of plates that rotate around a horizontally oriented axis to adjust the opening area of the passage in a variable manner. The pressure gauge 10 measures the pressure in the processing chamber 2. The measured value of the pressure gauge 10 is compared with a reference value, and on the basis of the comparison result, the angular position of the variable conductance valve 11 is changed and the conductance is adjusted. The exhaust speed is thereby adjusted, and the pressure in the processing chamber 2 is maintained at a value appropriate for processing.

The ionization phenomenon by plasmas is accompanied by a luminous phenomenon. The emission of the plasmas 8 generated during the plasma processing is observed by a spectrometer 13, which is a monitor, through an observation window 12 formed of a translucent member placed on a wall member of the side wall of the processing chamber 2, and the intensity of the emission is detected. The spectrometer 13 is also able to adjust the emission intensity according to the exposure time. A signal (emission information) related to the emission intensity of the plasmas 8 detected by the spectrometer 13 is transmitted to an analysis unit 14, which is placed so as to be communicable with the spectrometer 13, and is stored in the analysis unit 14. The analysis unit 14 performs wavelength identification calculations from the spectral waveform acquired from the spectrometer 13 and transmits the result to the display unit 15. The details of the analysis unit 14 are described with reference to FIG. 2 described later. The display unit 15 displays the wavelength identification result received from the analysis unit 14. The analysis unit 14 is equipped with a touch panel, which is capable of displaying and inputting information, as an input device that allows an operator to perform an input operation, in, for example, the display unit 15. A keyboard or the like, however, may be provided, instead of the touch panel.

Figure 2:
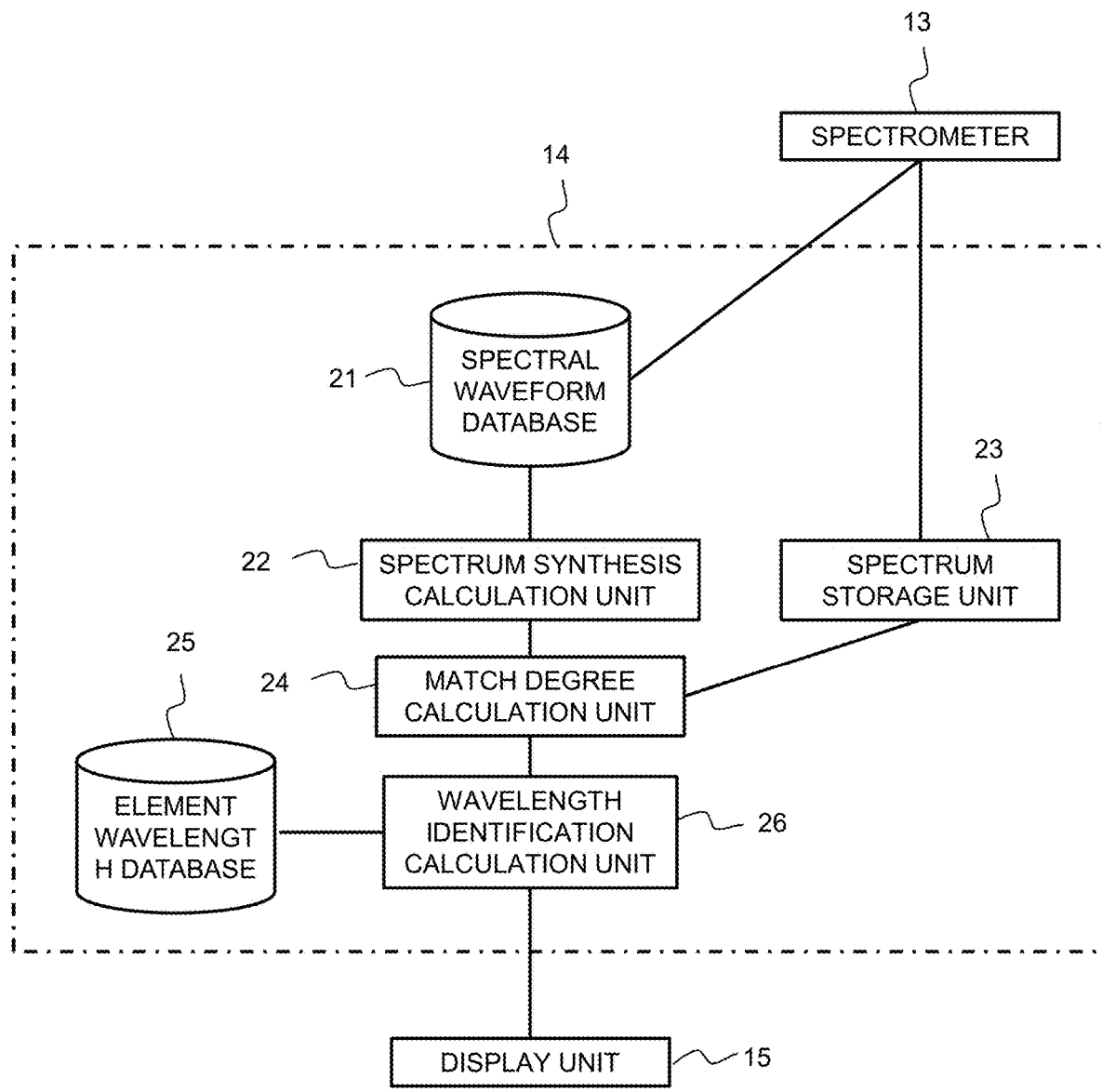
FIG. 2 is a schematic diagram illustrating an analysis unit according to the embodiment of the present invention.

FIG. 2 is a schematic diagram illustrating the outline of the analysis unit 14. The analysis unit 14, which functions as a data analysis apparatus, has a spectral waveform database 21, a spectrum synthesis calculation unit 22, a spectrum storage unit 23, a match degree calculation unit 24, an element wavelength database 25, and a wavelength identification calculation unit 26.

Figure 3:
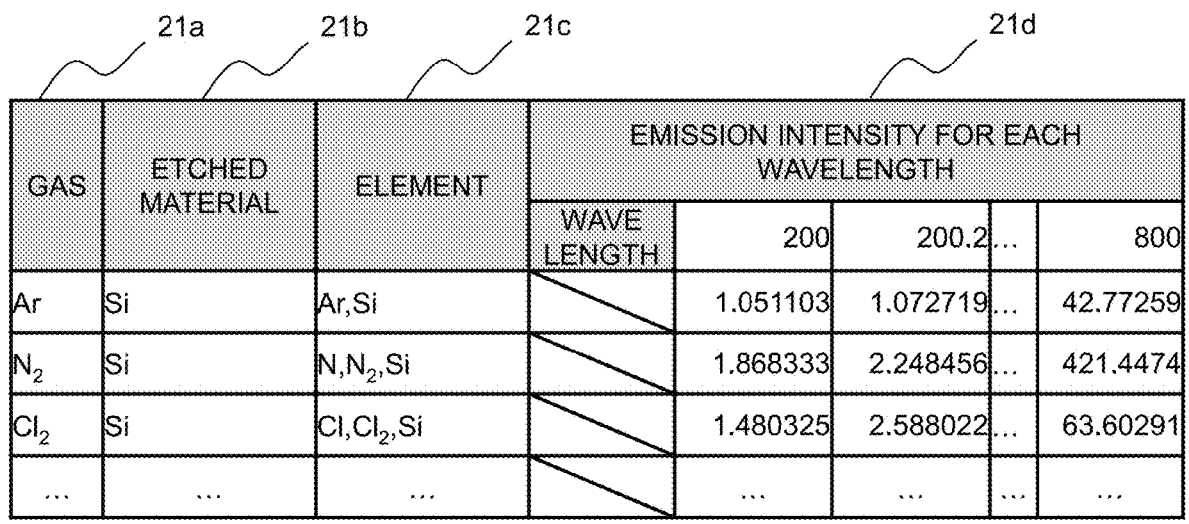
FIG. 3 is a diagram illustrating an example of a table in a spectral waveform database according to the embodiment of the present invention.

The spectral waveform database 21 registers (stores) the spectral waveform acquired by the spectrometer 13 for each gas type and each etched material. An example of registration of the spectral waveform database 21 is illustrated in FIG. 3.

The spectrum synthesis calculation unit 22 performs a calculation to synthesize one or more spectral waveforms stored in the spectral waveform database 21 into one spectral waveform by applying a weight coefficient to each spectral waveform.

The spectrum storage unit 23 stores the spectral waveforms to be analyzed, which have been acquired by the spectrometer 13.

The match degree calculation unit 24 compares the synthesized spectral waveform calculated by the spectrum synthesis calculation unit 22 with the spectral waveform to be analyzed stored in the spectrum storage unit 23, and calculates the match degree.

Figure 4:
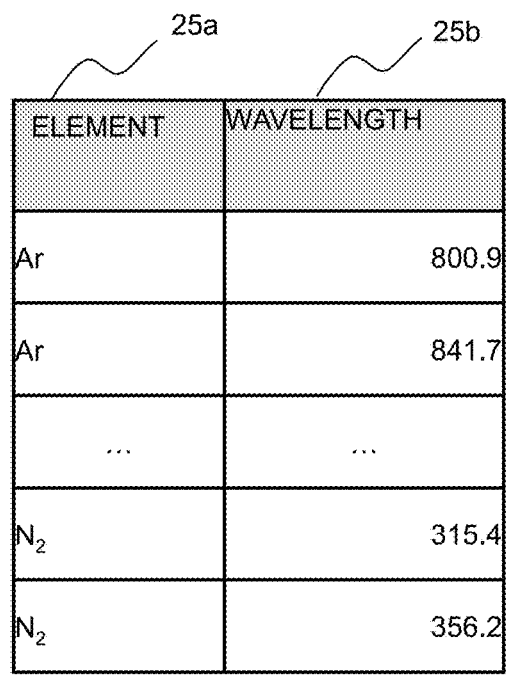
FIG. 4 is a diagram illustrating an example of a table in an element wavelength database according to the embodiment of the present invention.

The element wavelength database 25 is a database having a peak wavelength for each element, in which an element name (information on a chemical element or a molecule) is registered in association with the peak wavelength. A registration example of the element wavelength database 25 is illustrated in FIG. 4.

The wavelength identification calculation unit 26 performs calculation for identifying the element corresponding to the peak wavelength by using the weight coefficient of the spectrum synthesis calculation unit 22 and the peak wavelength and peak intensity in the element wavelength database 25.

FIG. 3 illustrates an example of data stored in the spectral waveform database 21. In this database, fields such as a gas type column 21a, an etched material column 21b, an element column 21c, an emission intensity column 21d for each wavelength, and the like are associated with each other.

Figure 6:
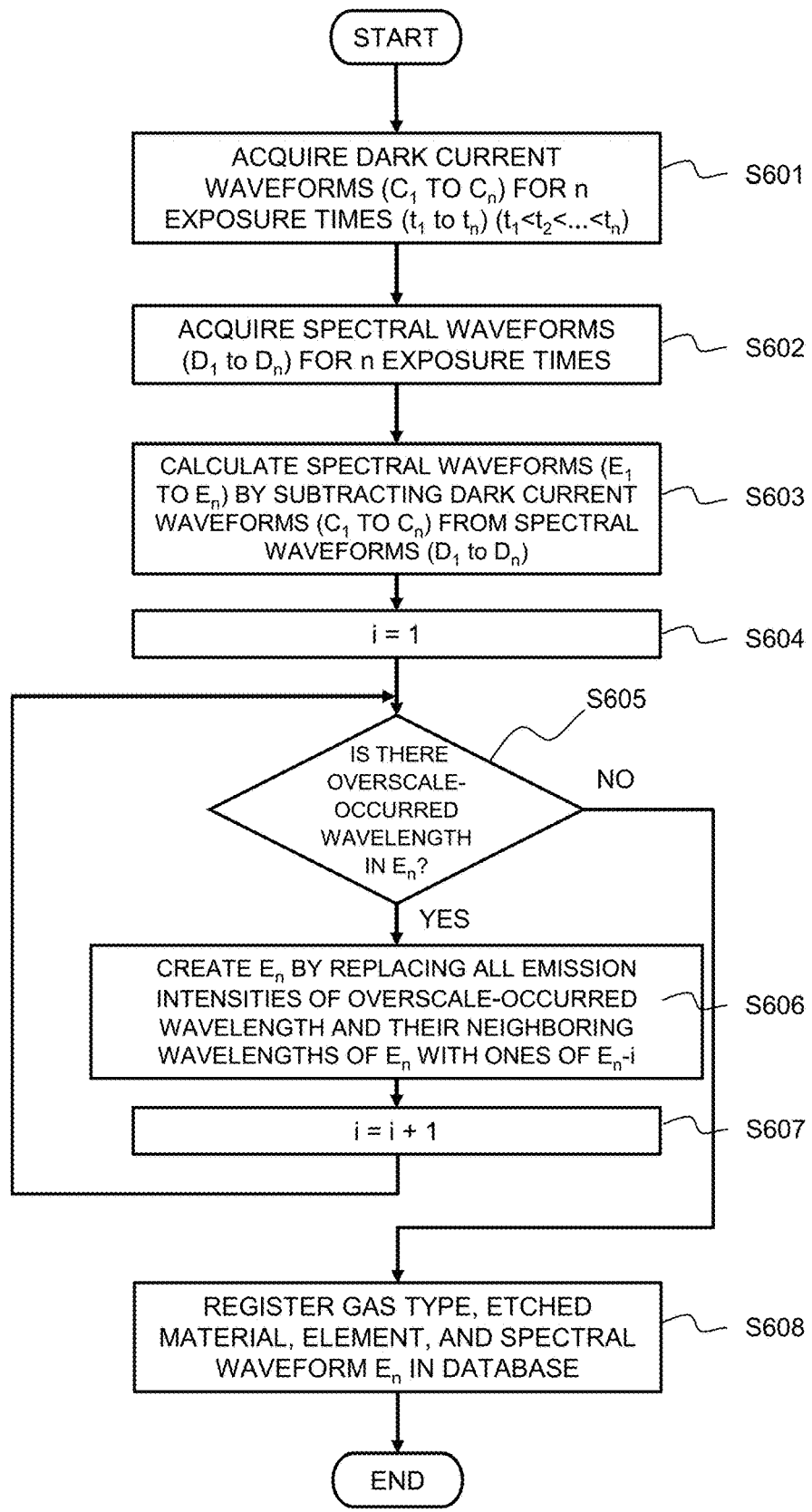
FIG. 6 is a diagram illustrating a processing flow of spectral waveform database creation according to the embodiment of the present invention.

In the gas type column 21a and the etched material column 21b, there are stored the gas type and the etched material used in the plasma processing performed during the database creation processing illustrated in FIG. 6. In the element column 21c, there is stored a list of elements that may be included in the gas type and etched material. In the emission intensity column 21d for each wavelength, there is stored the emission spectrum acquired by the spectrometer 13 in the plasma processing performed under the conditions registered in the gas type column 21a and the etched material column 21b. In step 608 of FIG. 6, the registration processing is performed for the gas type column 21a, the etched material column 21b, the element column 21c, and the emission intensity column 21d for each wavelength.

FIG. 4 illustrates an example of the element wavelength database 25. In this database, the respective fields such as an element column 25a, a wavelength column 25b, and the like are associated with each other.

In the element column 25a, there is stored an element that may be included in the gas and etched material. In the wavelength column 25b, there is stored the wavelength of light emitted by the element in the element column 25a.

Figure 5:
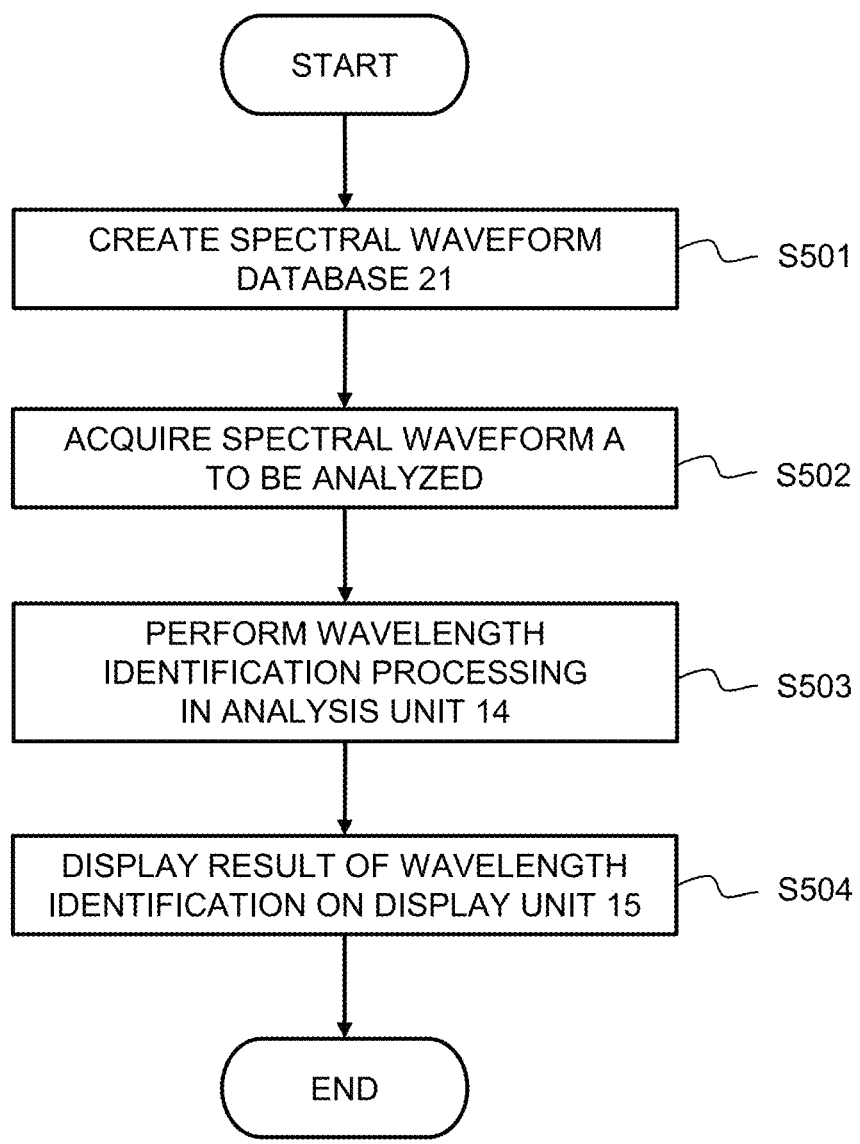
FIG. 5 is a diagram illustrating an overall processing flow according to the embodiment of the present invention.

FIG. 5 is a diagram illustrating an overall processing flow according to this embodiment. The operation based on FIG. 5 is as described in the following steps.

(Step 501)

Plasma processing (etching processing) is performed for each gas type and each etched material, and the spectral waveform database 21 is created as a reference. The details of the processing of creating the spectral waveform database 21 are described later with reference to FIG. 6.

(Step 502)

When arbitrary plasma processing to be analyzed is performed, the analysis unit 14 acquires the spectral waveform A (also referred to as "first spectral waveform") to be analyzed by the spectrometer 13 and stores the spectral waveform A in the spectrum storage unit 23.

(Step 503)

The analysis unit 14 performs wavelength identification processing on the spectral waveform to be analyzed acquired in step 502. The details of the wavelength identification processing in the analysis unit are described later with reference to FIG. 10.

(Step 504)

Figure 17:
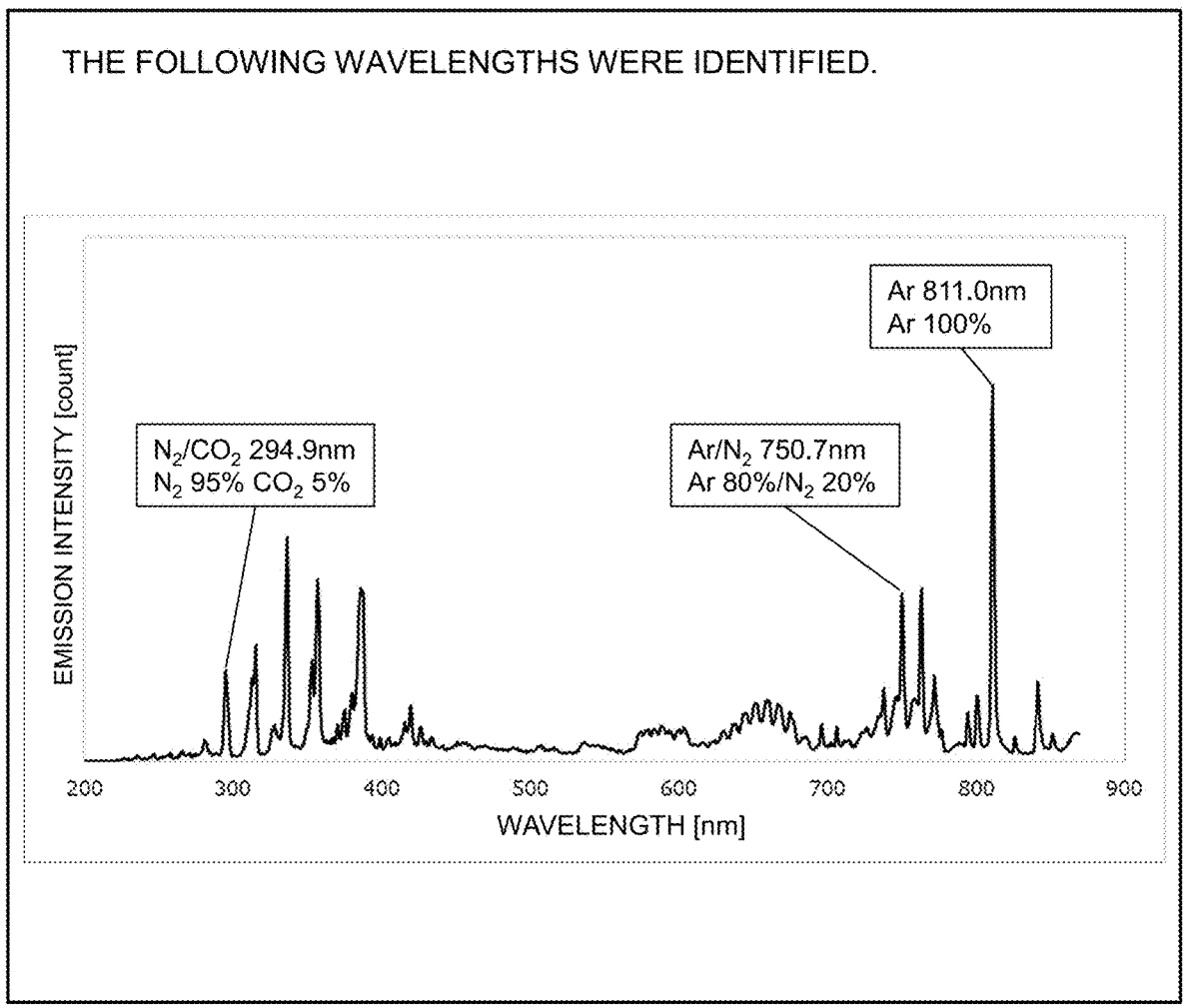
FIG. 17 is a diagram illustrating a display screen according to the embodiment of the present invention.

The analysis unit 14 transmits the result of the wavelength identification acquired in step 503 to the display unit 15, which thereby displays the element name, the peak wavelength, and the contribution degree of each element on the display screen. The contribution degree is an index of the magnitude of each element to the emission intensity of the extracted peak wavelength. FIG. 17 illustrates an example of the display.

FIG. 6 is a diagram illustrating a detailed flow of step 501 of the overall processing flow illustrated in FIG. 5. By performing this processing flow for each gas type and each etched material, a database is created. The operation based on FIG. 6 is as described below.

(Step 601)

On the spectrometer 13, n dark current waveforms $C_1$ to $C_n$ are acquired for n exposure times ($t_1$ to $t_n$) set to measure the emission of plasmas, where the exposure times are assumed to have a relationship of $t_1 < t_2 < \ldots t_n$. The dark current waveforms are acquired when plasma processing is not being performed by the plasma processing apparatus 1.

(Step 602)

The n spectral waveforms $D_1$ to $D_n$ are acquired for n exposure times set in step 601. The spectral waveforms are acquired when plasma processing is being performed by the plasma processing apparatus 1.

(Step 603)

For each exposure time set in step 601, spectral waveforms $E_1$ to $E_n$ are calculated by subtracting the dark current waveforms $C_1$ to $C_n$ acquired in step 601 from the spectral waveforms $D_1$ to $D_n$ acquired in step 602.

(Step 604)

The initial value i of the number of iterations from step 605 to step 607 is set to 1.

(Step 605)

If there is no overscale-occurred wavelength among the spectral waveform $E_n$ with the largest exposure time calculated in Step 603, then the control proceeds to step 608.

Otherwise, the control proceeds to step 606. The occurred overscale is determined by, for example, the performance of the spectrometer 13.
(Step 606)

In step 605, a new spectral waveform (also referred to as "third spectral waveform") $E_n$ is created by replacing all the emission intensities of the overscale-occurred wavelengths and their neighboring wavelengths, with values obtained by multiplying the emission intensity of the spectral waveform $E_{n-i}$, which has been obtained from a measurement with a shorter exposure time than the spectral waveform $E_n$, by $t_n/t_{n-i}$ to adjust the scale. In this specification, a calculation is performed by dividing the exposure time of the overscale-occurred spectral waveform by the exposure time of the spectral waveform whose exposure time is shorter than the overscale-occurred spectral waveform and then multiplying the spectral waveform whose exposure time is shorter than the overscale-occurred spectral waveform by the value obtained by the division.
(Step 607)

One is added to the number of iterations i, and the control proceeds to step 605. If there is no more overscale-occurred wavelength, the control proceeds to step 608.
(Step 608)

The gas type used in the plasma processing is registered in the gas type column 21*a*, the etched material used in the plasma processing is registered in the etched material column 21*b*, and the elements included in the gas type and etched material used in the plasma processing are registered in the element column 21*c*, and the spectral waveform $E_n$ created in steps 605 to 607 is registered as a spectral waveform $B_n$ in the emission intensity column 21*d* for each wavelength.

Figure 7:
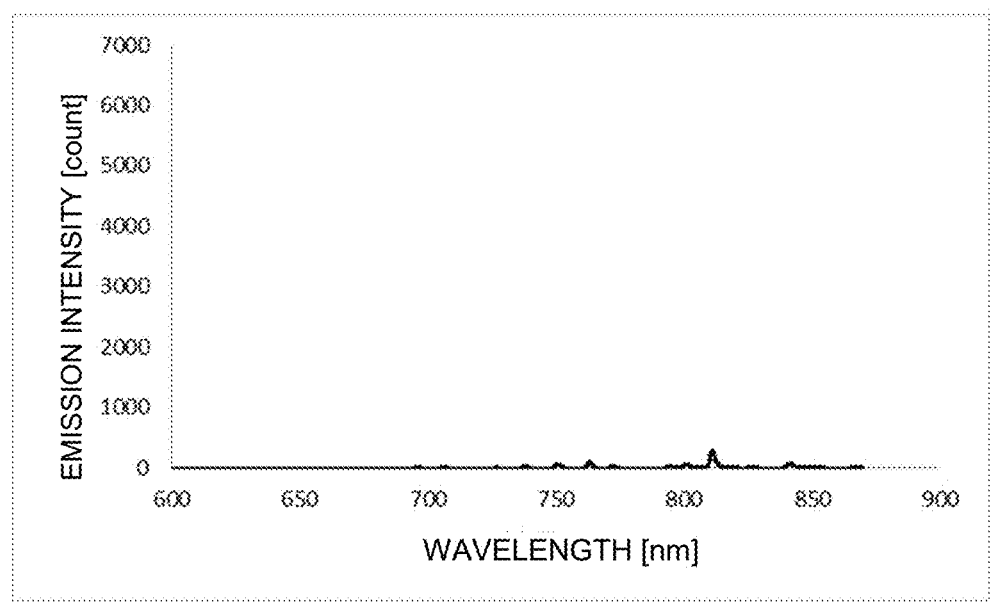
FIG. 7 is an example of a spectral waveform to be registered in the spectral waveform database according to the embodiment of the present invention.
Figure 8:
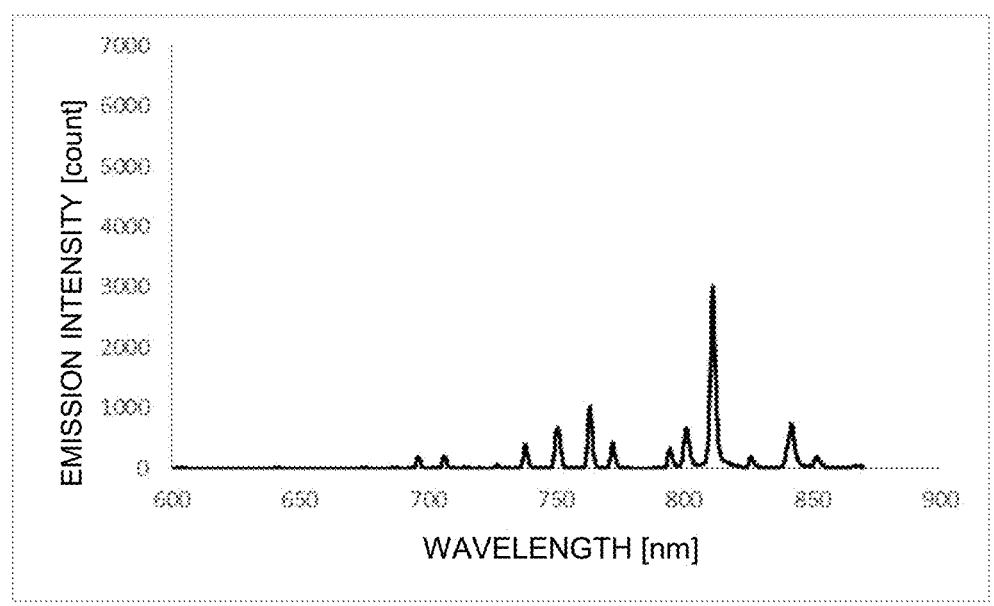
FIG. 8 is an example of a spectral waveform to be registered in the spectral waveform database according to the embodiment of the present invention.
Figure 9:
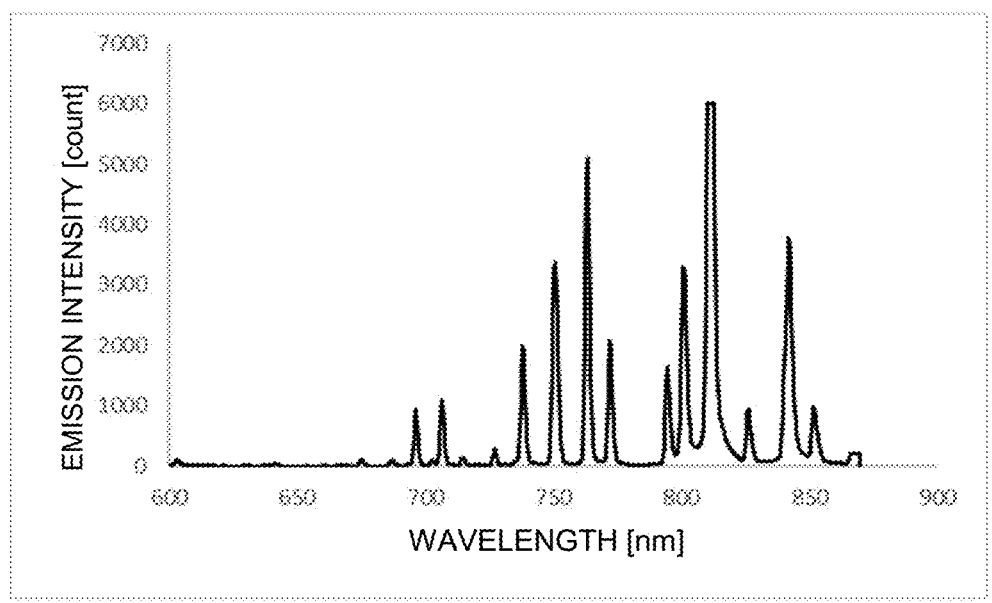
FIG. 9 is an example of a spectral waveform to be registered in the spectral waveform database according to the embodiment of the present invention.

Then, the procedure of steps 605 to 607 is described by giving specific examples. FIG. 7 illustrates an example of a spectral waveform $E_1$ with exposure time set to $t_1$, FIG. 8 illustrates a spectral waveform $E_2$ with exposure time set to $t_2$, and FIG. 9 illustrates a spectral waveform $E_3$ with exposure time set to $t_3$. In these examples, the number of exposure times is three, but any number of exposure times may be used as long as the number of exposure times is two or more.

If it is determined in step 605 that the overscale is occurred in the region around 810 nm of the spectral waveform $E_3$ illustrated in FIG. 9, the control proceeds to the next step is 606.

In step 606, the emission intensity of the region around 810 nm where the overscale is occurred, is extracted from $E_2$, and a new spectral waveform $E_3$ is created by multiplication by $t_3/t_2$ and replacement, and the control returns from the next step 607 to step 605.

If in the spectral waveform $E_3$ created in the above step 606, the overscale is also occurred, then the same processing is performed in the spectral waveform $E_1$. In this manner, steps 605 to 607 are repeated until there is no overscale in the new spectral waveform $E_3$.

Figure 10:
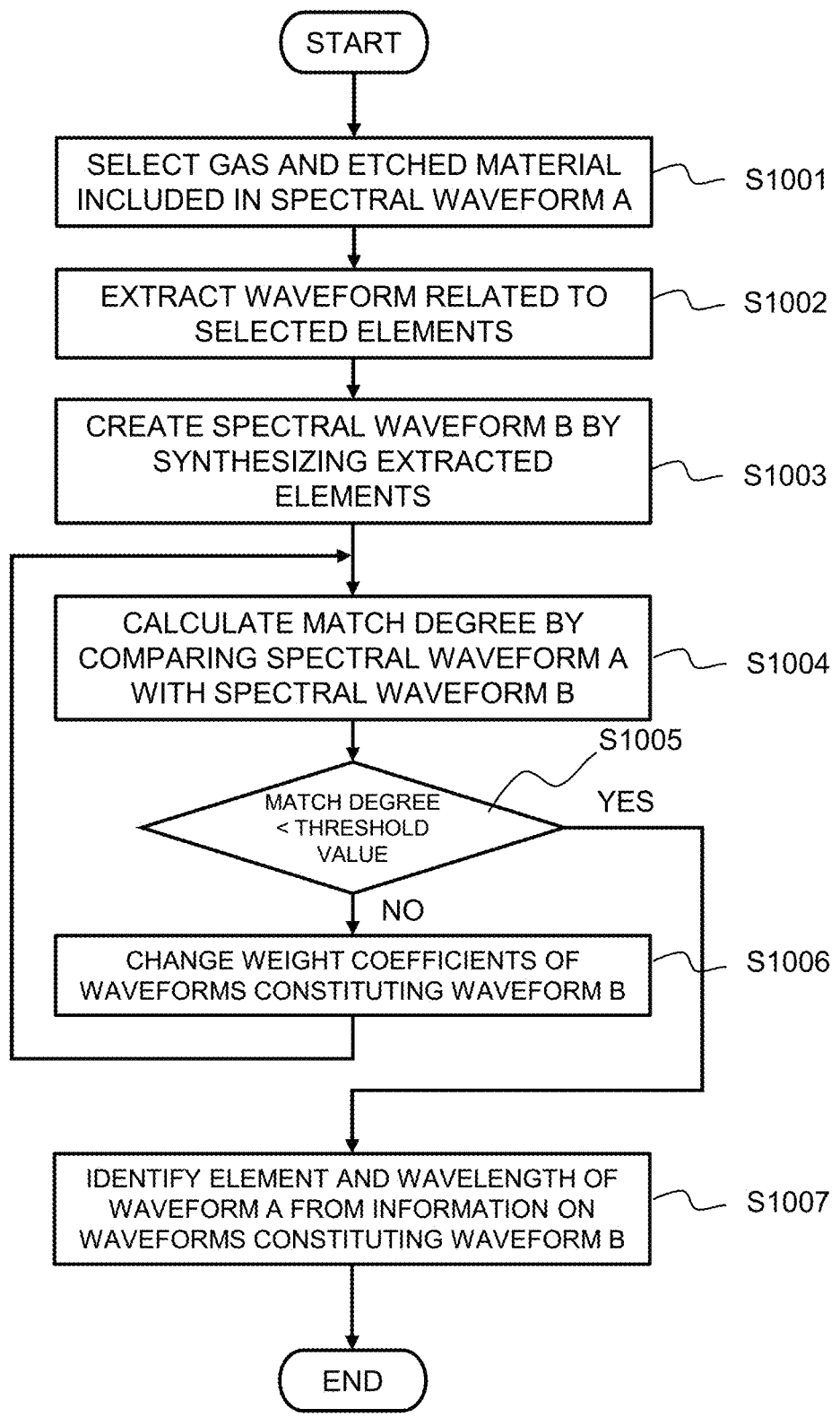
FIG. 10 is a diagram illustrating a processing flow for an operator and the analysis unit according to the embodiment of the present invention.
Figure 16:
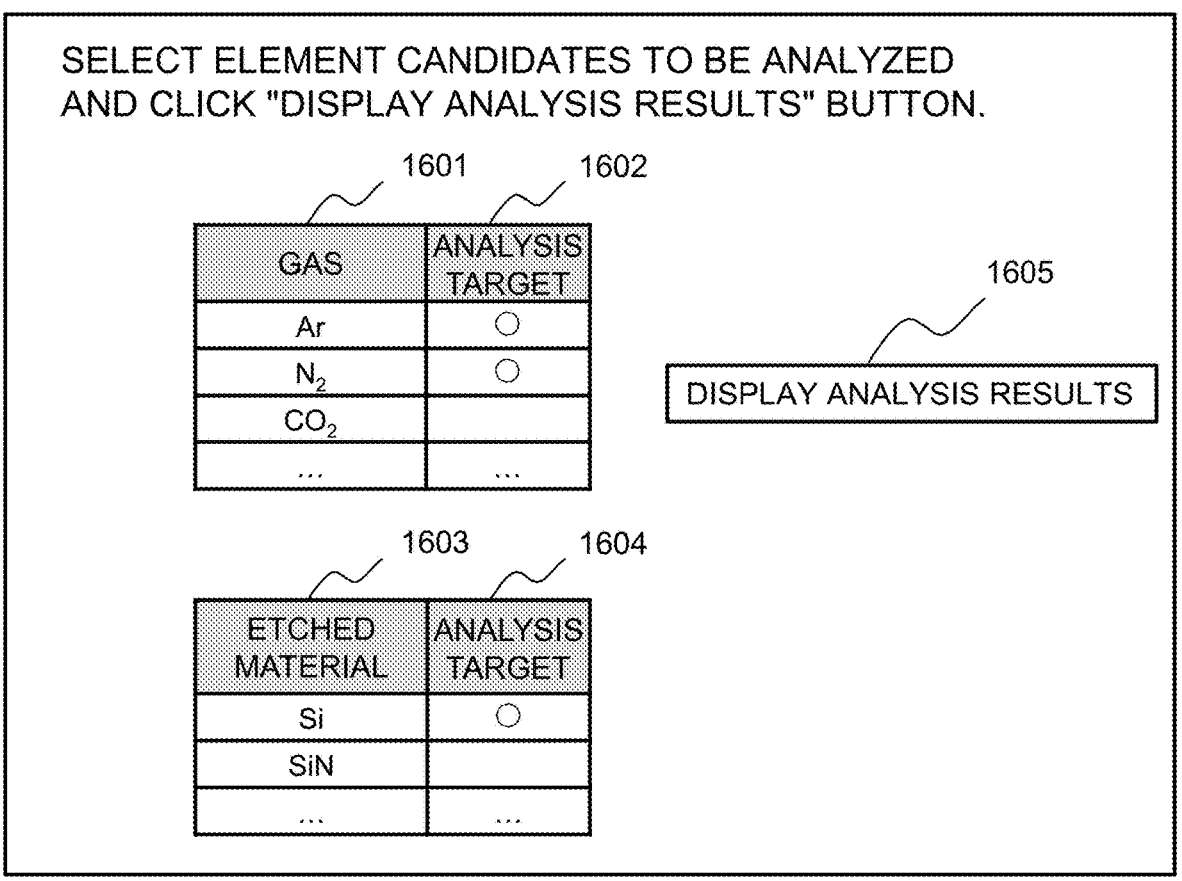
FIG. 16 is a diagram illustrating an input screen according to the embodiment of the present invention.

FIG. 10 is a diagram illustrating a detailed flow of step 503 of the overall processing flow illustrated in FIG. 5. The analysis unit 14 identifies a wavelength by the following operations. The input screen illustrated in FIG. 16 is displayed on the touch panel of the display unit 15, by which the operator is able to input information while viewing the displayed screen.
(Step 1001)

On the input screen illustrated in FIG. 16, the operator selects a gas from the gas type column 1601, wherein the gas is included in the spectral waveform A acquired in step 502, and inputs "o" in the analysis target column 1602 corresponding thereto. Thereby, the analysis unit 14 receives information that the gas with "o" input in the analysis target column 1602 has been selected.

Similarly, the operator selects the etched material from the etched material column 1603 and inputs "o" in the analysis target column 1604 corresponding thereto. Thereby, the analysis unit 14 receives information that the etched material with "o" input in the analysis target column 1604 has been selected. The selection of an etched material, however, is not necessarily required. After the selection, the operator is allowed to press the "Display analysis results" button 1605. Thereby, the analysis unit 14 receives information that the operator's input is complete.
(Step 1002)

When the information that the operator's input is complete is transmitted to the analysis unit 14, the analysis unit 14 thereupon extracts data from the emission intensity column 21*d* for each wavelength of all registered wavelengths and transmits the data to the spectrum synthesis calculation unit 22, where the gas type selected in step 1001 is contained in the gas type column 21*a* and the etched material selected in step 1001 is contained in the etched material column 21*b* in the spectral waveform database 21.
(Step 1003)

Subsequently, the analysis unit 14 creates a spectral waveform B (also referred to as "second spectral waveform") by applying weight coefficients to the spectral waveforms extracted in step 1002 in association with the chemical elements or molecules in the spectrum synthesis calculation unit 22, respectively, for synthesis. For example, the spectral waveform B is calculated by the following Equation 1 where B is the synthesized spectral waveform, n is the number of spectral waveforms to be synthesized, $B_j$ is the j-th spectral waveform, and $w_j$ is the weight coefficient applied to the j-th spectral waveform. In addition, the equation provided here is for the case where the weight coefficient $w_j$ has the same value for all the spectral waveforms, but it may have a different value for each wavelength.

$$B = \sum_{j=1}^{n} B_j w_j \quad \text{[Equation 1]}$$

(Step 1004)

Furthermore, the analysis unit 14 compares the spectral waveform A acquired in step 502 with the spectral waveform B created in step 1003 in the match degree calculation unit 24 to calculate the match degree. For example, the match degree is calculated by the following Equation 2, where M is the value of the match degree, m is the number of wavelengths of spectral waveforms, and $A_k$ and $B_k$ indicate the emission intensities of the k-th wavelength of the spectral waveform A and the spectral waveform B, respectively. It can be seen that the smaller the value of M, the more the spectral waveform A matches the spectral waveform B.

$$M = \sum_{k=1}^{m} |A_k - B_k| \quad \text{[Equation 2]}$$

(Step 1005)

If the value of the match degree M calculated in step 1004 is greater than a threshold value, it indicates that the spectral waveform A does not sufficiently match the spectral waveform B, and therefore the control proceeds to step 1006, where the analysis unit 14 processes the spectral waveform B.

(Step 1006)

The analysis unit 14 changes the weight coefficients of the respective spectral waveforms that constitute the spectral waveform B in the spectrum synthesis calculation unit 22 to create a new spectral waveform B. Here, the weight coefficients are changed by using, for example, the gradient method or the like so that the value of the match degree M is small.

Thereafter, the control proceeds to step 1004, where the analysis unit 14 recalculates the value of the match degree M by using the new spectral waveform B, and compares the value of the match degree M with the threshold value in the subsequent step 1005. If the recalculated value of the match degree M is greater than or equal to the threshold value, the control proceeds to step 1006, where the analysis unit 14 calculates the new spectral waveform B and performs the same processing in steps 1004 and 1005. On the other hand, if the value of the match degree M is smaller than the threshold value in step 1005, the flow proceeds to step 1007.

(Step 1007)

The analysis unit 14 uses the wavelength identification calculation unit 26 to acquire the registered peak wavelengths, including the data of the element column 21c of the waveforms constituting the spectral waveform B, from the element wavelength database 25, and to acquire data, as the emission intensities of the peak wavelength and the wavelengths around the peak wavelength, from the emission intensity column 21d for each wavelength of the spectral waveform database 21. After the data acquisition, the analysis unit 14 calculates the contribution degree by using the emission intensity of the peak wavelength and the weight coefficient of the waveform, outputs the element name, the peak wavelength, and the contribution degree, and transmits them to the display unit 15. The element name, the peak wavelength, and the contribution degree are information on the gas type and the etched material used in the plasma processing to be analyzed, and the element name and the contribution degree are displayed on the display unit 15 for each peak wavelength. This information enables identification of the element names of the gas type and the etched material used in the plasma processing to be analyzed.

For example, in the display example illustrated in FIG. 17, in the case of the peak waveform with the peak wavelength of 294.9 nm, the contribution degree of $N_2$ is 95% and the contribution degree of $CO_2$ is 5%. In the case of the peak waveform with the peak wavelength of 750.7 nm, the contribution degree of Ar is 80% and the contribution degree of $N_2$ is 20%. Furthermore, in the case of the peak waveform with the peak wavelength of 811.0 nm, the contribution degree of Ar is 100%. This means that the processing chamber where the plasma processing to be analyzed is performed contains $CO_2$ and $N_2$ in addition to the input gas type.

For example, the contribution degree is calculated by the following Equation 3, where C is a contribution degree, w is a weight coefficient, p is the number of wavelengths around the peak wavelength, $W_l$ is the l-th wavelength, and $I_l$ is the emission intensity of the l-th wavelength.

$$C = w \times \sum_{l=2}^{p}(W_l - W_{l-1}) \times I_l \quad \text{[Equation 3]}$$

In addition to the calculation of the contribution degree, the value of the match degree M illustrated in the Equation 2 may be calculated for each peak waveform (the peak wavelength and its neighboring wavelengths) to exclude the peak waveforms with low values of the match degree M from the identification results, thereby increasing the accuracy of the identification.

Figure 13:
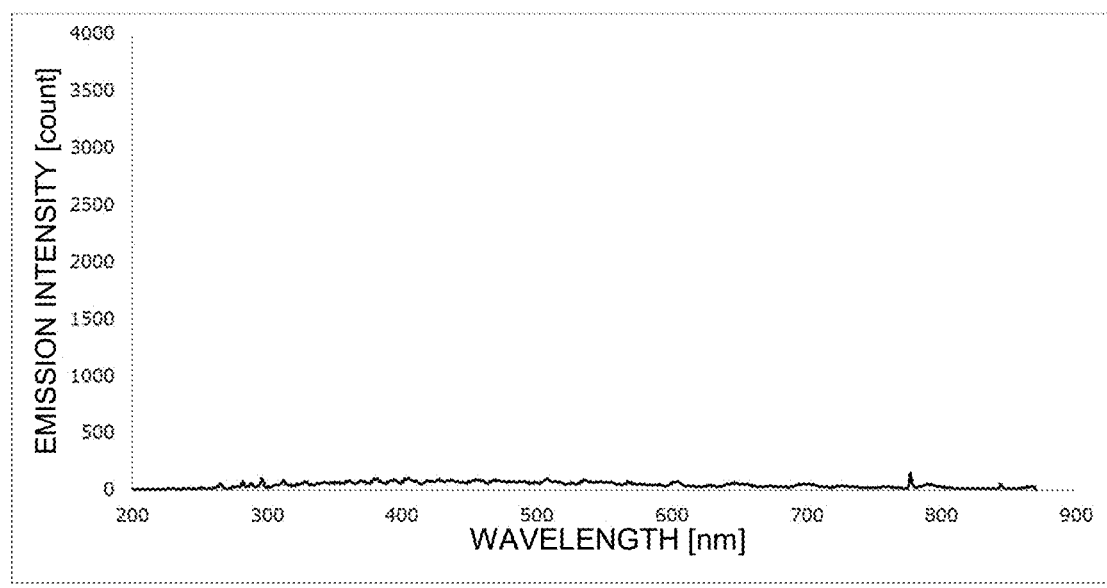
FIG. 13 is an example of a spectral waveform of $CO_2$.
Figure 14:
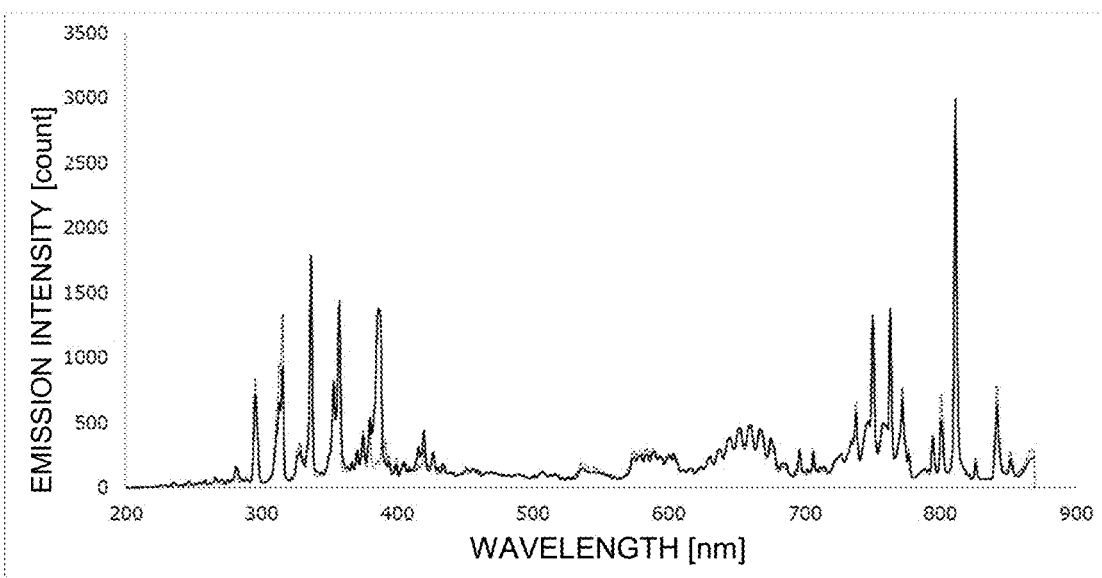
FIG. 14 is a diagram illustrating an example of a fitting result between the spectral waveform to be analyzed and the spectral waveform synthesized from spectral waveforms of the database.

FIG. 14 is a diagram illustrating an example of a fitting result between the spectral waveform to be analyzed and the spectral waveform synthesized from spectral waveforms in the database. The solid line in the diagram represents the spectral waveform of a mixed gas of $Ar+N_2+CO_2$, and the dashed line in the diagram represents a synthesized waveform acquired by applying weight coefficients to the spectral waveform of Ar illustrated in FIG. 11, the spectral waveform of $N_2$ illustrated in FIG. 12, and the spectral waveform of $CO_2$ illustrated in FIG. 13.

Figure 11:
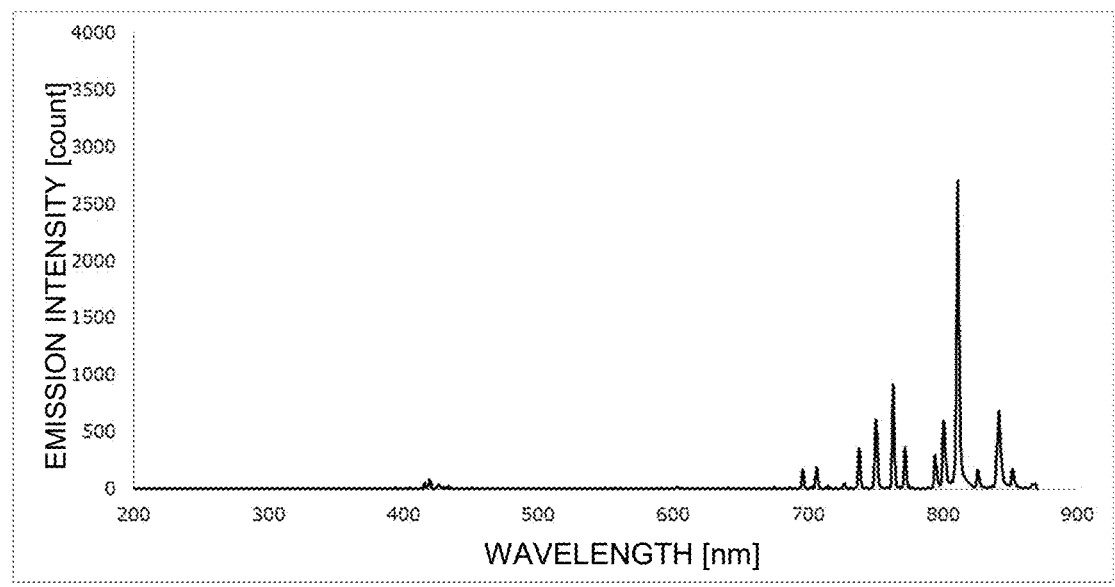
FIG. 11 is an example of a spectral waveform of Ar.
Figure 12:
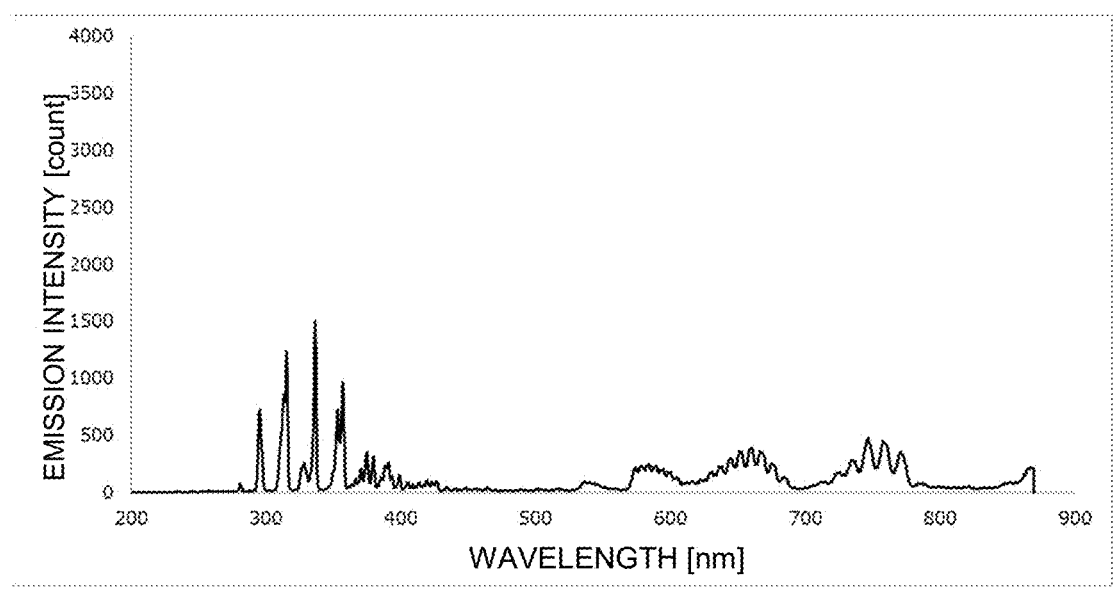
FIG. 12 is an example of a spectral waveform of $N_2$.

The spectral waveforms in FIGS. 11, 12, and 13 have the spectral features represented by the solid line in FIG. 14, and the solid and dashed lines in FIG. 14 are relatively well fitted.

In the solid and dashed lines in FIG. 14, however, there is a peak that the solid and dashed lines do not coincide with each other at around 380 nm to 390 nm. This is a peak of CN, which is a substance that is generated in plasmas where $N_2$ and $CO_2$ are mixed, but not in plasmas of only $N_2$ or only $CO_2$. Therefore, a waveform with the CN peak is not present in the spectral waveform database 21 that is created by using only a single gas. Therefore, for the purpose of increasing the identification accuracy, peaks that do not match may be taken out and registered in the spectral waveform database 21 as a new CN waveform.

Figure 15:
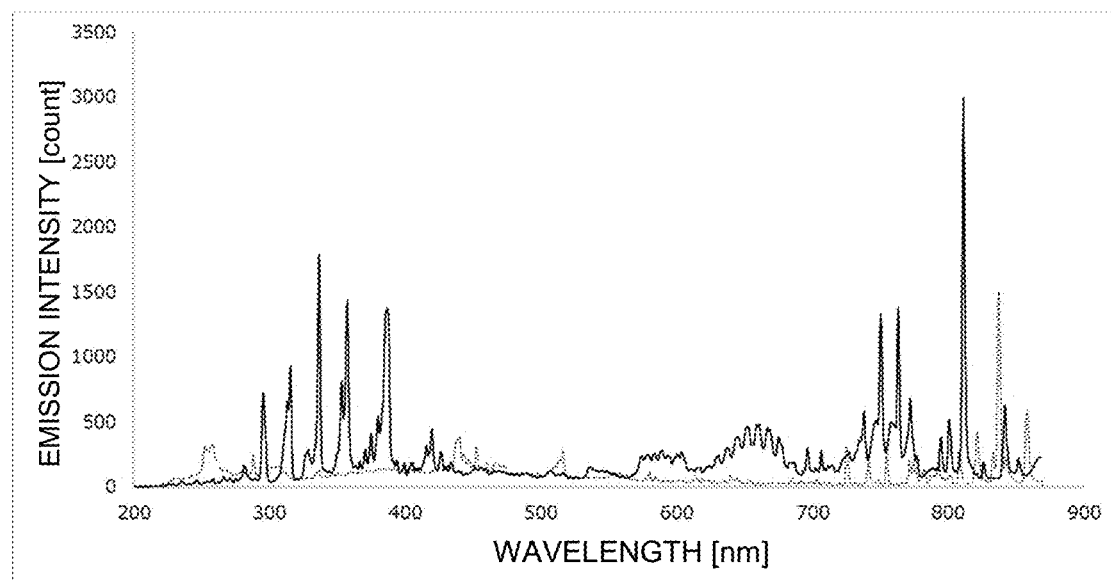
FIG. 15 is a diagram illustrating an example of a fitting result between the spectral waveform to be analyzed and the spectral waveform synthesized from the spectral waveforms of the database.

FIG. 15 is a diagram illustrating a fitting result in the case where a spectral waveform is obtained by synthesizing the spectrums represented by the dashed line in FIG. 14 with the spectral waveforms of $Cl_2$ and $CF_4$. The solid line in FIG. 15 represents a spectral waveform of a mixed gas of $Ar+N_2+CO_2$ as in FIG. 14, and therefore Ar, $N_2$, and $CO_2$ should be selected as gas types in a normal situation, but $Cl_2$ and $CF_4$ are selected instead, in this example. In this case, the spectral waveform is not fitted even if the weights are adjusted, and therefore the use of this embodiment enables suppression of false wavelength identification.

Second Embodiment

Figure 18:
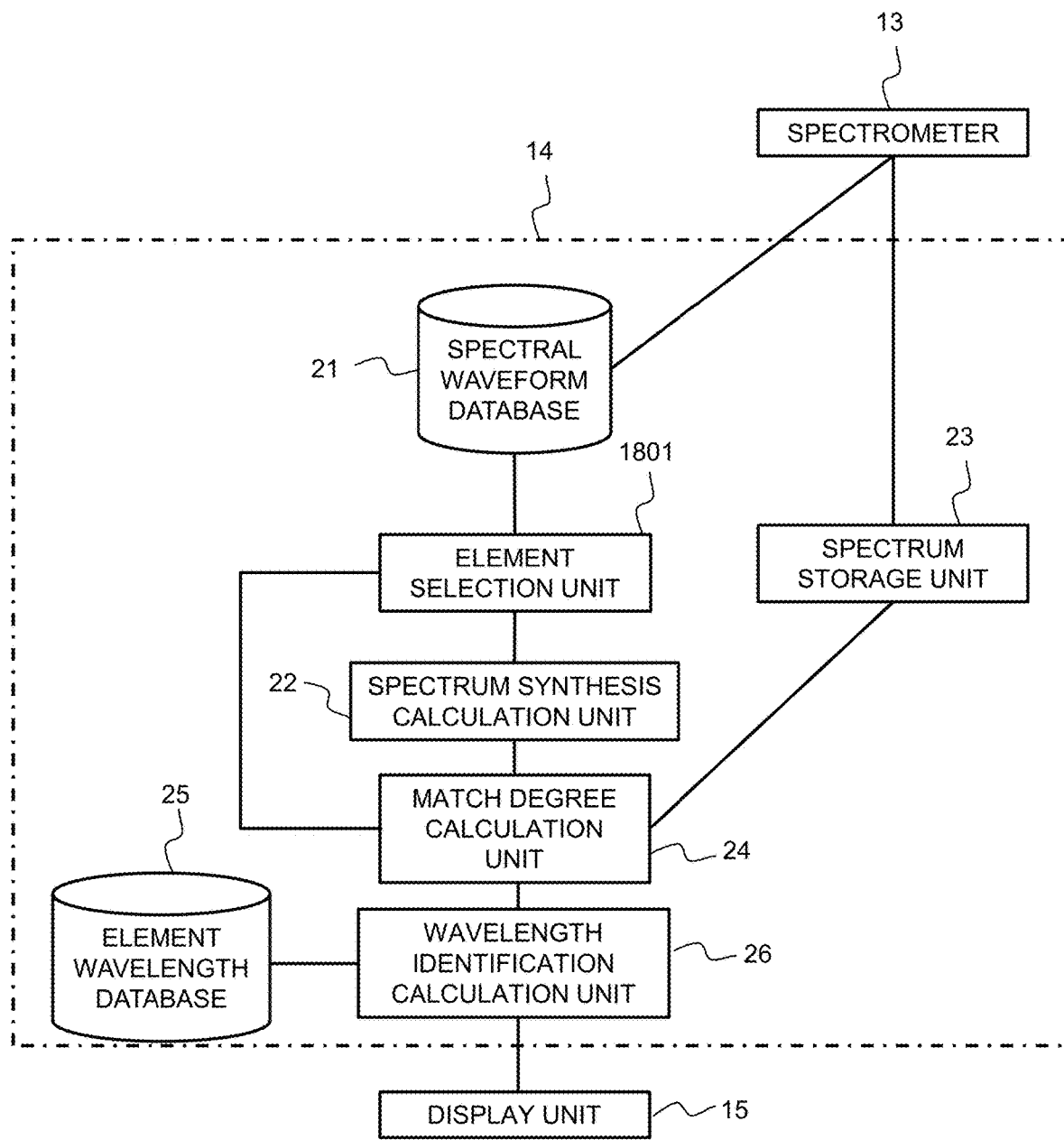
FIG. 18 is a schematic diagram illustrating an analysis unit according to another embodiment of the present invention.

In this embodiment, instead of selecting elements by the operator, elements are automatically selected by providing an element selection unit 1801 in the analysis unit 14 as illustrated in FIG. 18. Therefore, the input screen illustrated in FIG. 16 is unnecessary in this embodiment.

The element selection unit 1801 is able to select elements to obtain better results, with reference to the calculation result of the match degree calculation unit 24. For example, providing the element selection unit 1801 with a deep learning function enables the optimal elements to be selected without processing all the data.

Figure 19:
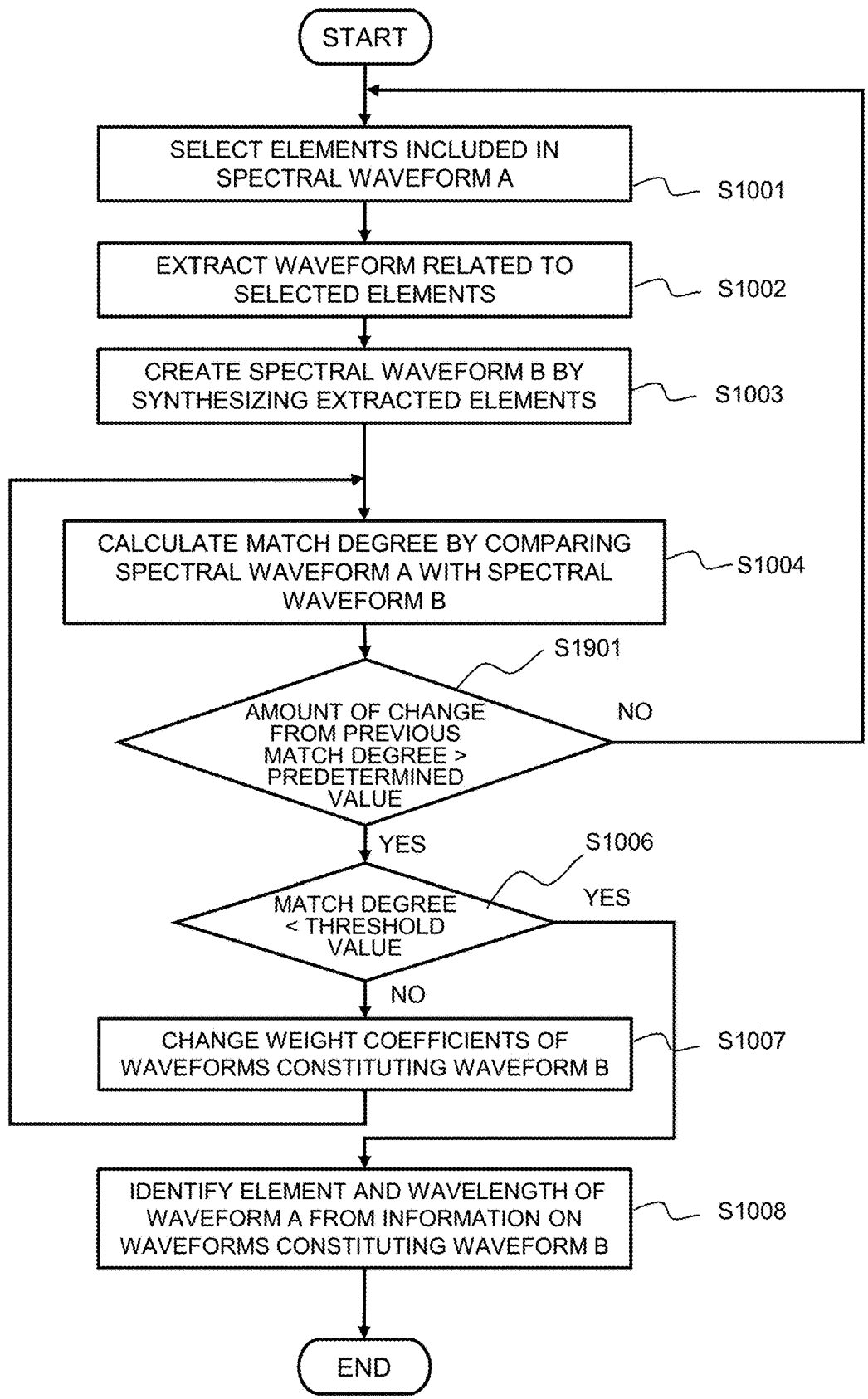
FIG. 19 is a diagram illustrating a processing flow for an operator and an analysis unit according to another embodiment of the present invention.

FIG. 19 is a diagram illustrating the processing flow of the analysis unit 14 in this embodiment. Only the steps that differ from those of the processing flow in FIG. 10 are described below.

(Step 1001)

The element selection unit 1801 selects the gas type and the etched material included in the spectral waveform A acquired in step 502.

(Step 1901)

If the change amount of the match degree calculated in step 1004 is less than or equal to a predetermined value, the control proceeds to step 1001, where the analysis unit 14 reselects elements again. Thereafter, the analysis unit 14 performs the same processing until the change amount of the match degree exceeds the predetermined value.

Thus, according to the analysis unit 14 of this embodiment, elements are automatically selected to reduce the operator's workload and to prevent human errors such as wrong element selections, thereby increasing the accuracy of wavelength identification.

The present invention is not limited to the above embodiments, but includes various variations. For example, the above embodiments have been described in detail in order to describe the present invention in an easy-to-understand manner, and is not necessarily limited to those having all the described configurations. It is possible to replace a part of the configuration of one embodiment with the configuration of another embodiment, and it is also possible to add the configuration of one embodiment to the configuration of another embodiment. It is also possible to perform addition, deletion, or replacement for a part of the configuration of each embodiment.

As an example of application of the described embodiments, there is conceivable a semiconductor device manufacturing system, in which an application for operating and managing a line including semiconductor manufacturing equipment is executed on a platform. In this case, by performing processing with at least the analytical processing function of the analysis unit 14 as the application on the platform, the present embodiments are able to be applied to the above-mentioned semiconductor device manufacturing system.

In addition, all or a part of each of the above components, functions, processing units, processing means, and the like may be implemented by software, for example, by a processor executing a program that implements each of the functions. The programs, tables, files, and other information that implement the respective functions can be stored in a recording device such as a memory, a hard disk, a solid state drive (SSD) or in a recording medium such as an IC card, an SD card, or a DVD.

DESCRIPTION OF REFERENCE NUMERALS 1 plasma processing apparatus
2 processing chamber
3 mass flow controller
4 radio-frequency power supply for plasma generation
5 exhaust device
6 wafer
7 sample table
8 plasmas
9 radio-frequency power supply for bias
10 pressure gauge
11 variable conductance valve
12 observation window
13 spectrometer
14 analysis unit
15 display unit
21 spectral waveform database
22 spectrum synthesis calculation unit
23 spectrum storage unit
24 match degree calculation unit
25 element wavelength database (elemental or molecular wavelength database)
26 wavelength identification calculation unit
1601 gas type column
1602 analysis target column
1603 etched material column
1604 analysis target column
1605 button
1801 element selection unit (chemical element or molecule selection unit)

The invention claimed is:

1. A plasma processing apparatus comprising:
a processing chamber in which a sample is plasma-processed;
a radio-frequency power supply that supplies radio-frequency power to generate plasmas; and
a sample table on which the sample is placed,
wherein the plasma processing apparatus further comprises an analysis unit that identifies chemical elements or molecules in monitored plasmas on the basis of a match degree between a first spectral waveform and a second spectral waveform, the match degree being obtained by comparing the first spectral waveform with the second spectral waveform, the first and second spectral waveforms being spectral waveforms of the emission of the monitored plasmas, and
wherein the second spectral waveform is a spectral waveform multiplied by a weight coefficient corresponding to the chemical element or the molecule.

2. The plasma processing apparatus according to claim 1, wherein the analysis unit outputs information on the chemical element or the molecule in the case where the match degree is less than a threshold value.

3. The plasma processing apparatus according to claim 1, wherein the analysis unit adjusts the weight coefficient so that the match degree is smaller.

4. The plasma processing apparatus according to claim 1,
wherein, in the case where the match degree is less than the threshold value, the analysis unit extracts a peak wavelength of the second spectral waveform and calculates the contribution degree on the basis of the emission intensity of the extracted peak wavelength and the weight coefficient, and
wherein the contribution degree is an index indicating the magnitude of each of the chemical elements or each of the molecules in the emission intensity of the extracted peak wavelength.

5. The plasma processing apparatus according to claim 4, further comprising a display unit that displays the chemical element or the molecule and the contribution degree for each of the peak wavelengths.

6. The plasma processing apparatus according to claim 1, further comprising a spectrometer that outputs data of the emission of the monitored plasmas and adjusts the intensity of the emission of the plasmas by exposure time, wherein:
in the case where an overscale of the emission intensities at some wavelengths of the second spectral waveform is occurred, the analysis unit replaces the overscale-occurred second spectral waveform with a third spectral waveform;
the third spectral waveform is a spectral waveform, for which a second spectral waveform, having a shorter exposure time than the exposure time of the overscale-occurred second spectral waveform, is calculated; and
the calculation is performed by multiplying the second spectral waveform, having the shorter exposure time than the exposure time of the overscale-occurred second spectral waveform, by a value obtained by dividing the exposure time of the overscale-occurred second spectral waveform by the exposure time of the second spectral waveform having the shorter exposure time than the overscale-occurred second spectral waveform.

7. The plasma processing apparatus according to claim 1, wherein the analysis unit has an element selection unit that selects chemical elements or molecules on the basis of the match degree.

8. A data analysis apparatus comprising an analysis unit that identifies chemical elements or molecules in monitored plasmas on the basis of a match degree between a first spectral waveform and a second spectral waveform, the match degree being obtained by comparing the first spectral waveform with the second spectral waveform, the first and second spectral waveforms being spectral waveforms of the emission of the monitored plasmas, wherein the second spectral waveform is a spectral waveform multiplied by a weight coefficient corresponding to the chemical element or the molecule in the plasmas.

9. A semiconductor device manufacturing system connected to a semiconductor manufacturing device via a network and having a platform where analysis processing is performed to identify chemical elements or molecules in plasmas, wherein the analysis processing includes a step of identifying chemical elements or molecules in monitored plasmas on the basis of a match degree between a first spectral waveform and a second spectral waveform, the match degree being obtained by comparing the first spectral waveform with the second spectral waveform, the first and second spectral waveforms being spectral waveforms of the emission of the monitored plasmas, and wherein the second spectral waveform is a spectral waveform multiplied by a weight coefficient corresponding to the chemical element or the molecule in the plasmas.

10. The semiconductor device manufacturing system according to claim 9, wherein the analysis processing is performed as an application provided on the platform.

\* \* \* \* \*